(12) United States Patent
Kuo et al.

(10) Patent No.: US 12,394,768 B2
(45) Date of Patent: Aug. 19, 2025

(54) PACKAGE STRUCTURE

(71) Applicant: GaNrich Semiconductor Corporation, Hsinchu (TW)

(72) Inventors: Jia-Tay Kuo, Hsinchu (TW); Chiao Fu, Hsinchu (TW); Sheng-Bo Wang, Hsinchu (TW); Chen-Yu Wang, Hsinchu (TW); Yao-Zhong Liu, Hsinchu (TW)

(73) Assignee: GaNrich Semiconductor Corporation, Hsinchu (TW)

( * ) Notice: Subject to any disclaimer, the term of this patent is extended or adjusted under 35 U.S.C. 154(b) by 205 days.

(21) Appl. No.: 18/113,774

(22) Filed: Feb. 24, 2023

(65) Prior Publication Data

US 2023/0275073 A1 Aug. 31, 2023

Related U.S. Application Data (60) Provisional application No. 63/313,869, filed on Feb. 25, 2022.

(51) Int. Cl.

| | |
|---|---|
| *H01L 25/16* | (2023.01) |
| *H01L 23/00* | (2006.01) |
| *H03K 17/08* | (2006.01) |
| *H01L 23/498* | (2006.01) |

(52) U.S. Cl.
CPC .............. *H01L 25/16* (2013.01); *H01L 24/48* (2013.01); *H03K 17/08* (2013.01); *H01L 23/49827* (2013.01); *H01L 24/49* (2013.01); *H01L 2224/48137* (2013.01); *H01L 2224/48225* (2013.01); *H01L 2224/49111* (2013.01); *H01L 2924/12035* (2013.01); *H01L 2924/13064* (2013.01); *H01L 2924/19105* (2013.01)

(58) Field of Classification Search
CPC ......... H01L 25/16; H01L 23/00; H01L 24/48; H01L 2924/12035; H01L 27/0629; H03K 17/08; H03K 17/08104
USPC ...................................... 361/93.7–93.9, 91.1
See application file for complete search history.

(56) References Cited

U.S. PATENT DOCUMENTS

| | | | | |
|---|---|---|---|---|
| 6,888,711 | B2 * | 5/2005 | Kohno | H03K 17/0822 361/84 |
| 2016/0307886 | A1 * | 10/2016 | Roberts | H01L 27/0248 |
| 2018/0248540 | A1 * | 8/2018 | Ishii | H03K 3/013 |
| 2020/0395933 | A1 * | 12/2020 | Arisawa | H03K 17/6877 |

* cited by examiner

*Primary Examiner* — Danny Nguyen
(74) *Attorney, Agent, or Firm* — Patterson + Sheridan, LLP (57) ABSTRACT

A package structure is provided herein, which includes a substrate, an integrated transistor, and an encapsulation structure. The integrated transistor is disposed on the substrate and includes a transistor, a capacitor, a resistor, a first Zener diode, and a second Zener diode. The transistor includes a gate, a drain, and a source. The capacitor is electrically connected to the gate, and the resistor is electrically connected to the gate. The first Zener diode includes a first anode and a first cathode electrically connected to the gate. The second Zener diode includes a second anode electrically connected to the first anode and a second cathode electrically connected to the source. The encapsulation structure encapsulates the integrated transistor. The package structure includes a gate terminal, a drain terminal, and a source terminal.

16 Claims, 9 Drawing Sheets

PACKAGE STRUCTURE

CROSS REFERENCE TO RELATED APPLICATIONS

This application claims the benefit of U.S. Provisional Application No. 63/313,869, filed on Feb. 25, 2022, the entirety of which is incorporated by reference herein.

BACKGROUND OF THE INVENTION

Field of the Invention

The present disclosure relates to a package structure, in particular to a package structure combining a high electron mobility transistor (HEMT) and a protection circuit.

Description of the Related Art

The gate-to-source voltage of a conventional enhancement-mode high electron mobility transistor (E-Mode HEMT), such as an enhancement-mode gallium nitride transistor, can withstand a maximum of about −10V to 7V. However, the driving voltage output by the conventional power conversion control circuit is about 0V to 20V. When the highest voltage of the external driving voltage is directly applied to the E-Mode HEMT, the E-Mode HEMT is easily damaged. Therefore, a protection circuit is often disposed between the E-Mode HEMT and the driving voltage to ensure the normal operation of the E-Mode HEMT.

However, an additional protection circuit takes up an additional circuit area and increases the complexity of the overall circuit design. Therefore, it is necessary to optimize the enhancement-mode high electron mobility transistor and its protection circuit.

BRIEF SUMMARY OF THE INVENTION

One aspect of the disclosure relates to a package structure packaging the transistor and a protection circuit. By integrating the transistor and a protection circuit in the same package, the distances among the gate of the transistor and the resistor, capacitor, and Zener diodes are shortened to reduce the parasitic inductance, which is beneficial for improving the durability of transistor. Furthermore, the package structure packaging the transistor and the protection circuit of the present disclosure can reduce the overall required circuit area on the circuit board to increase heat dissipation, reduce the defective rate in the mounting process, such as surface mounted technology (SMT) mounting process, and even reduce the complexity of the circuit design as well.

In certain embodiments, a package structure is provided, which includes: a substrate, an integrated transistor, and an encapsulation structure. The integrated transistor is disposed on the substrate. The integrated transistor includes a transistor, a capacitor, a resistor, a first Zener diode, and a second Zener diode. The transistor includes a gate, a drain, and a source. The capacitor is electrically connected to the gate. The resistor is electrically connected to the gate. The first Zener diode includes a first anode and a first cathode, wherein the first cathode is electrically connected to the gate. The second Zener diode includes a second anode and a second cathode, wherein the second anode is electrically connected to the first anode, and the second cathode is electrically connected to the source. The encapsulation structure encapsulates the integrated transistor. The package structure includes a gate terminal, a drain terminal, and a source terminal.

According to an embodiment of the present disclosure, the transistor is an enhancement-mode high electron mobility transistor.

According to an embodiment of the present disclosure, the package structure further includes a first carrier, a second carrier, and a third carrier. The first carrier is disposed on the substrate, wherein the second cathode is electrically connected to the source through the first carrier. The second carrier is disposed on the substrate, wherein the drain is electrically connected to the second carrier. The third carrier is disposed on the substrate, wherein the gate is electrically connected to the third carrier.

According to an embodiment of the present disclosure, the package structure further includes a fourth carrier. The fourth carrier is disposed on the substrate, wherein the gate is electrically connected to the first cathode through the fourth carrier, and the capacitor and the resistor are electrically connected between the third carrier and the fourth carrier respectively.

According to an embodiment of the present disclosure, the transistor and the second Zener diode are disposed on the first carrier, the first Zener diode is disposed on the fourth carrier, and the capacitor and the resistor are disposed between the third carrier and the fourth carrier.

According to an embodiment of the present disclosure, each of the first carrier, the second carrier, the third carrier, and the fourth carrier is a conductive carrier. The gate is adjacent to the fourth carrier, and the gate is electrically connected to the fourth carrier through a first metal bonding wire. The first Zener diode is electrically connected to the second Zener diode through a second metal bonding wire, and the capacitor and the resistor are respectively bridged connected between the third carrier and the fourth carrier.

According to an embodiment of the present disclosure, the package structure further includes a first bottom plate, a second bottom plate, a third bottom plate, and a fourth bottom plate. The first bottom plate is disposed below the substrate and the first carrier. The second bottom plate is disposed below the substrate and the second carrier. The third bottom plate is disposed below the substrate and the third carrier. The fourth bottom plate is disposed below the substrate, the first carrier, and the transistor. The first bottom plate, the second bottom plate, and the third bottom plate are electrically connected to the first carrier, the second carrier, and the third carrier respectively through respective connecting elements.

According to an embodiment of the present disclosure, the source terminal includes the first bottom plate, the drain terminal includes the second bottom plate, and the gate terminal includes the third bottom plate.

According to an embodiment of the present disclosure, the first carrier is electrically connected to the fourth bottom plate through a connecting element.

According to an embodiment of the present disclosure, the substrate includes a plurality of through-holes through the substrate, and the connecting elements are formed in the through-holes respectively.

According to an embodiment of the present disclosure, the substrate includes a plurality of side surfaces, and the connecting elements are formed on one of the side surfaces.

According to an embodiment of the present disclosure, the package structure further includes a fifth carrier and a fifth bottom plate. The fifth carrier and the first carrier are separated from each other and disposed on the substrate. The fifth bottom plate is disposed below the substrate and the fifth carrier. The fifth carrier is electrically connected to the fifth bottom plate through a connecting element.

According to an embodiment of the present disclosure, the third carrier includes a gap and/or the fourth carrier includes a gap.

According to an embodiment of the present disclosure, the gap of the third carrier is T-shaped and/or the gap of the fourth carrier is T-shaped.

According to an embodiment of the present disclosure, the package structure further includes an insulating plate, a sixth carrier, and a seventh carrier. The insulating plate is disposed on the substrate. The sixth carrier and the seventh carrier are disposed on the insulating plate respectively, wherein the sixth carrier is electrically connected to the gate terminal. The source and the second cathode are electrically connected to the substrate, and the capacitor and the resistor are electrically connected to the sixth carrier and the seventh carrier.

According to an embodiment of the present disclosure, the first Zener diode is disposed on the sixth carrier, and the capacitor and the resistor are disposed between the sixth carrier and the seventh carrier.

According to an embodiment of the present disclosure, the gate of the transistor is adjacent to the sixth carrier, and the gate is electrically connected to the sixth carrier by a metal bonding wire.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION OF THE INVENTION

The following descriptions are exemplary embodiments of the present disclosure for the purpose of illustrating the general principles of the present disclosure and should not be construed as limited to the embodiments set forth herein. The scope of the present disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments. In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In addition, in this specification, relative spatial expressions are used. For example, "lower", "bottom", "higher" or "top" may be used in the embodiments to describe the relative relationship of one element to another element. It should be appreciated that if a device in a drawing is flipped upside down, an element that is "lower" will become an element that is "higher".

It can be understood that, although the terms "first", "second", "third", etc. may be used herein to describe various elements, components, regions, layers and/or sections, these elements, components, regions, layers and/or sections should not be limited by these terms, and these terms are only used to distinguish different elements, components, regions, layers and/or sections. Thus, a first element, component, region, layer and/or section discussed below can be termed as a second element, component, region, layer, and/or section without departing from the teachings of some embodiments of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms) used herein have the same meanings as those commonly understood by one of ordinary skill in the art to which the present disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless specifically defined in the embodiments of the present disclosure.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In the drawings, similar elements and/or features may have the same reference number. Various components of the same type can be distinguished by adding letters or numbers after the component symbol to distinguish similar components and/or similar features.

Figure 1:
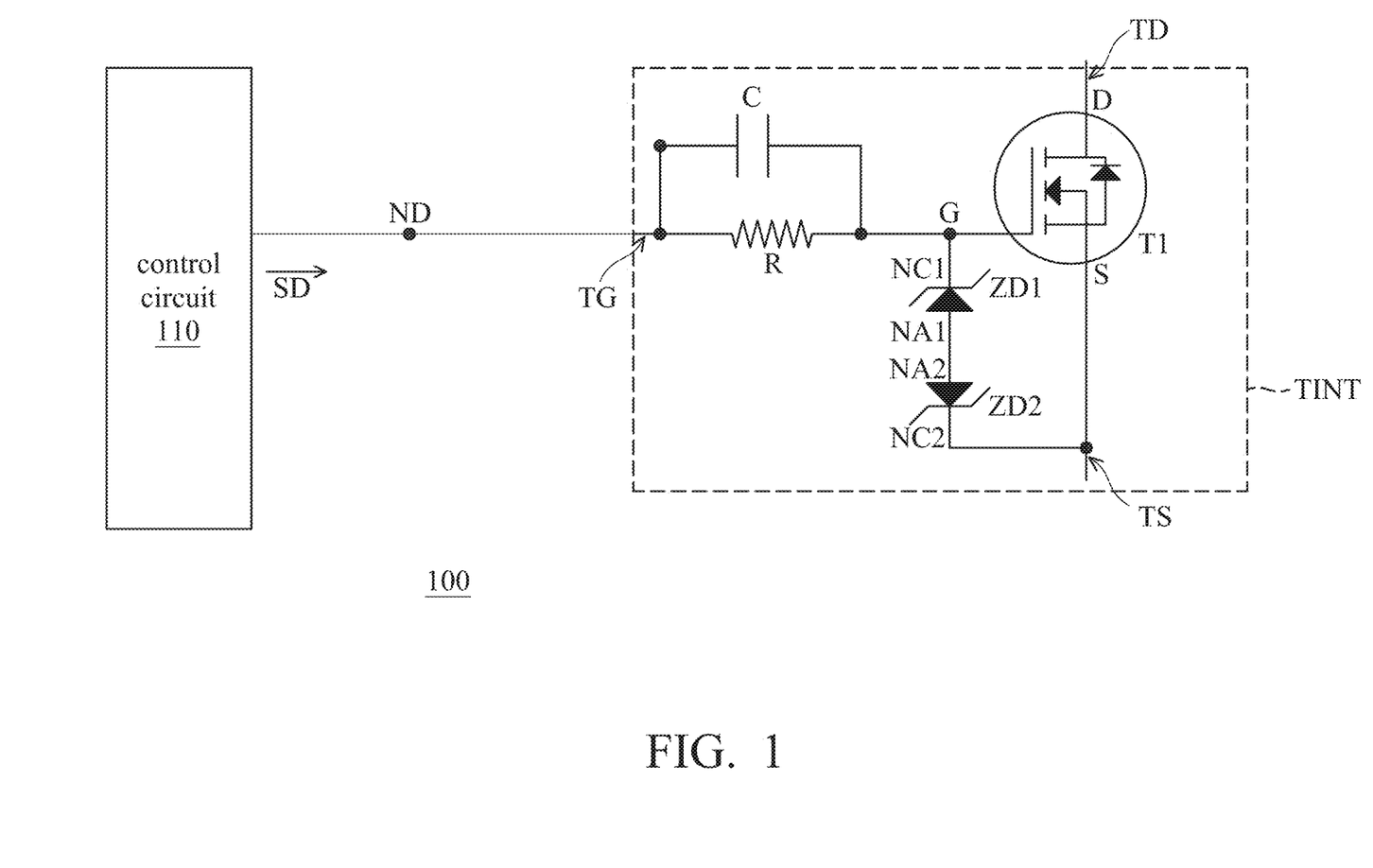
FIG. 1 shows a circuit diagram of an integrated circuit in accordance with an embodiment of the present disclosure.

FIG. 1 shows a circuit diagram of an integrated circuit 100 in accordance with an embodiment of the present disclosure. As shown in FIG. 1, the integrated circuit 100 includes a control circuit 110 and an integrated transistor TINT. The integrated transistor TINT includes a transistor T1, and a protection circuit. The protection circuit may include a resistor R, a capacitor C, a first Zener diode ZD1 and a second Zener diode ZD2.

As shown in FIG. 1, the control circuit 110 is configured to drive the driving node ND and to generate a driving signal SD. The transistor T1 includes a gate G, a drain D and a source S. According to some embodiments of the present disclosure, the transistor T1 is a high electron mobility transistor. According to an embodiment of the present disclosure, the transistor T1 may be an enhancement-mode high electron mobility transistor. According to another embodiment of the present disclosure, the transistor T1 may be an enhancement-mode gallium nitride transistor. The resistor R is electrically connected between the driving node ND and the gate G of the transistor T1, and the capacitor C is electrically connected between the driving node ND and the gate G of the transistor T1.

The first Zener diode ZD1 includes a first anode NA1 and a first cathode NC1, wherein the first cathode NC1 is electrically connected to the gate G of the transistor T1. The second Zener diode ZD2 includes a second anode NA2 and a second cathode NC2, wherein the second anode NA2 is electrically connected to the first anode NA1, and the second cathode NC2 is electrically connected to the source S of the transistor T1.

According to some embodiments of the present disclosure, when the driving voltage of the driving signal SD exceeds the voltage range of a normal operation of the transistor T1, the resistor R, the capacitor C, the first Zener diode ZD1 and the second Zener diode ZD2 are configured to protect the transistor T1 from burning out, and to maintain the normal operation of the transistor T1. In other words, the resistor R, the capacitor C, the first Zener diode ZD1 and the second Zener diode ZD2 can be configured as a protection circuit for the transistor T1.

As shown in FIG. 1, the transistor T1, the resistor R, the capacitor C, the first Zener diode ZD1, and the second Zener diode ZD2 are packaged together to form a package structure of the integrated transistor TINT, wherein the integrated transistor TINT includes a gate terminal TG, a drain terminal TD, and a source terminal TS. According to an embodiment of the present disclosure, in the integrated circuit 100, the driving node ND is electrically connected to the gate terminal TG of the integrated transistor TINT, and the drain D of the transistor T1 is electrically connected to the drain terminal TD of the integrated transistor TINT, and the source S of the transistor T1 is electrically connected to the source terminal TS of the integrated transistor TINT. The package structure of the integrated transistor TINT will be described in the following paragraphs.

According to other embodiments of the present disclosure, in the integrated circuit 100, other circuit elements, such as resistors and diodes, may be included between the driving node ND and the gate terminal TG of the integrated transistor TINT for further protecting the transistor T1 from damage. In one embodiment, other devices, such as the resistors and the diodes can be packaged in a package structure of the integrated transistor TINT. One or more of the resistance R, the capacitor C, the first Zener diode ZD1, and the second Zener diode ZD2 can be moved out of the package structure of the integrated transistor TINT and connected between the control circuit 110 and the integrated transistor TINT. The resistance R, the capacitor C, the first Zener diode ZD1, and the second Zener diode ZD2 herein are only illustrated as the protection circuit of the transistor T1 for explanation, which are not intended to be limited thereto.

Figure 2A:
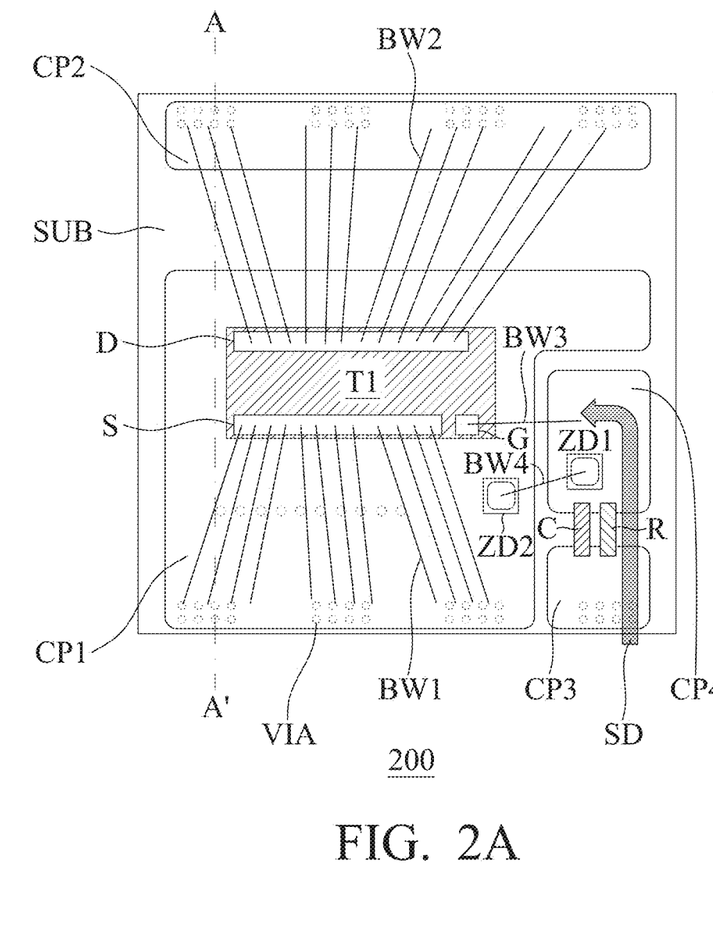
FIG. 2A shows a top view of a package structure in accordance with an embodiment of the present disclosure.

FIG. 2A shows a top view of a package structure 200 in accordance with an embodiment of the present disclosure, wherein the package structure 200 corresponds to the integrated transistor TINT in FIG. 1. According to an embodiment of the present disclosure, the package structure 200 may be a package structure of a surface mount device (SMD). As shown in FIG. 2A, the package structure 200 includes a substrate SUB, a first carrier CP1, a second carrier CP2, a third carrier CP3, and a fourth carrier CP4. According to some embodiments of the present disclosure, the substrate SUB includes an insulating material. According to an embodiment of the present disclosure, the substrate SUB may be a ceramic substrate, wherein the ceramic substrate includes the insulating material. According to an embodiment of the present disclosure, the insulating material may include aluminum oxide ($Al_2O_3$) or aluminum nitride (AlN).

The first carrier CP1 is formed on the substrate SUB, and the transistor T1 and the second Zener diode ZD2 in FIG. 1 are disposed on the first carrier CP1. The second cathode NC2 (not shown in FIG. 2A) of the second Zener diode ZD2 is electrically connected to the first carrier CP1 by direct or indirect contact. According to an embodiment of the present disclosure, the second cathode NC2 is fixed on the first carrier CP1 and electrically connected to the first carrier CP1 by soldering. According to an embodiment of the present disclosure, the structure of the transistor T1 includes an insulating substrate, a semiconductor epitaxial stack is disposed on the insulating substrate, and the gate G, the drain D, and the source S are disposed on the semiconductor epitaxial stack, wherein the semiconductor epitaxial stack includes a channel layer and a barrier layer formed thereon, and a two-dimensional electron gas (2DEG) is formed in the channel layer adjacent to its interface with the barrier layer as a current conduction channel when the transistor is turned on (not shown in FIG. 2A).

The semiconductor epitaxial stack of the transistor T1 may further include a nucleation layer formed on the insulating substrate, a buffer layer formed on the nucleation layer, and the channel layer and the barrier layer formed on the buffer layer. In one embodiment, the semiconductor epitaxial stack of the transistor T1 may further include a capping layer formed on the barrier layer. In one embodiment, the transistor T1 is a high electron mobility transistor. In one embodiment, the transistor T1 is an enhancement-mode high electron mobility transistor. In the enhancement-mode high electron mobility transistor, a p-type semiconductor layer may be interposed between the gate and the barrier layer. The two-dimensional electron gas in the channel layer below the gate and the p-type semiconductor layer is depleted by the p-type semiconductor layer, so that the transistor is turned off when no bias voltage is applied to the gate. The p-type semiconductor layer includes a p-type group III-V semiconductor layer or a p-type group II-VI semiconductor layer. The material of the p-type group III-V semiconductor layer includes p-type doped gallium nitride (p-GaN) or p-type doped boron nitride (p-BN). The material of the p-type group II-VI semiconductor layer includes p-type doped zinc oxide (p-ZnO). In another embodiment, the enhancement-mode high electron mobility transistor may be a gate-recessed enhancement-mode high electron mobility transistor (Gate-recessed E-mode HEMT), wherein the barrier layer below the gate has a recessed portion, and the gate is filled in the recessed portion. In one embodiment, materials of the nucleation layer, the buffer layer, the channel layer, and the barrier layer in the transistor T1 include group III-V compound semiconductor materials, such as group III nitride semiconductor materials. Group III nitride semiconductor material includes gallium nitride (GaN), aluminum nitride (AlN), aluminum gallium nitride (AlGaN), aluminum indium nitride (InAlN), indium gallium nitride (InGaN), indium aluminum gallium nitride (InAlGaN), or a combination thereof. The material energy gap of the barrier layer exceeds that of the channel layer. In one embodiment, the capping layer may include group III-V compound semiconductor materials, such as gallium nitride (GaN), or a dielectric material, such as silicon nitride.

Since the gate G, the drain D, and the source S are disposed on the same side of the transistor T1, the source S of the transistor T1 is electrically connected to the first carrier CP1 through a plurality of first metal bonding wires BW1 of the package structure 200. According to an embodiment of the present disclosure, the source S of the transistor T1 is electrically connected to the second Zener diode ZD2 through the first carrier CP1 and the second cathode NC2. The second carrier CP2 is formed on the substrate SUB, wherein the drain D of the transistor T1 is electrically connected to the second carrier CP2 through a plurality of second metal bonding wires BW2 of the package structure 200.

The third carrier CP3 and the fourth carrier CP4 are formed on the substrate SUB, and the first carrier CP1, the third carrier CP3, and the fourth carrier CP4 are adjacent to one another. The first Zener diode ZD1 is disposed on the fourth carrier CP4, and the first cathode NC1 (not shown in FIG. 2A) of the first Zener diode ZD1 is electrically connected to the fourth carrier CP4 by direct or indirect contact. According to an embodiment of the present disclosure, the first cathode NC1 is fixed on the fourth carrier CP4 and electrically connected to the fourth carrier CP4 by soldering. The gate G of the transistor T1 is electrically connected to the fourth carrier CP4 through a third metal bonding wire BW3, and is further electrically connected to the first Zener diode ZD1 through the fourth carrier CP4 and the first cathode NC1. As shown in FIG. 2A, the capacitor C and the resistor R in FIG. 1 are electrically connected between the third carrier CP3 and the fourth carrier CP4, and the first anode NA1 of the first Zener diode ZD1 (not shown in FIG. 2A) is electrically connected to the second anode NA2 of the second Zener diode ZD2 (not shown in FIG. 2A) through a fourth metal bonding wire BW4.

According to an embodiment of the present disclosure, the first carrier CP1, the second carrier CP2, the third carrier CP3, and the fourth carrier CP4 may be conductive carriers.

According to an embodiment of the present disclosure, the first carrier CP1, the second carrier CP2, the third carrier CP3, and the fourth carrier CP4 are separately disposed on the substrate SUB. According to other embodiments of the present disclosure, the package structure 200 further includes an encapsulation structure (not shown in FIG. 2), wherein the encapsulation structure is configured to encapsulate the integrated transistor TINT, the first carrier CP1, the second carrier CP2, the carrier CP3 and the fourth carrier CP4 to form the package structure 200. The encapsulation structure includes resin material, such as epoxy resin. In one embodiment, a material of the encapsulation structure may include black glue.

According to an embodiment of the present disclosure, as shown in FIG. 2A, when the driving signal SD is provided to the gate G of the transistor T1 through the third carrier CP3 of the package structure 200, the resistor R, the capacitor C, the fourth carrier CP4, and the third metal bonding wire BW3, since the first Zener diode ZD1 is disposed between the third metal bonding wire BW3 and the resistor R and the capacitor C, and is connected to the second Zener diode ZD2 in reverse series, the voltage of the driving signal SD is clamped by the first Zener diode ZD1 and the second Zener diode ZD2 before being provided to the gate G of the transistor T1.

In other words, the first Zener diode ZD1 is disposed between the third metal bonding wire BW3 and the resistor R and the capacitor C and is connected to the second Zener diode ZD2 in reverse series to ensure that the driving signal SD has been converted to a safe operation voltage range of the transistor T1 through the first Zener diode ZD1 and the second Zener diode ZD2 before being provided to the transistor T1, thereby protecting the transistor T1 from burning out.

As shown in FIG. 2A, the package structure 200 further includes one or more connecting elements VIA extending from an upper surface of the substrate SUB to a lower surface of the substrate SUB. According to an embodiment of the present disclosure, the connecting elements VIA are formed by forming a plurality of through-holes penetrating the substrate SUB, then forming a conductive layer by, for example, coating. The conductive layer can be filled in the through-holes in the structure of a metal pillar, or a metal film that is formed on the sidewalls of the through-holes but does not fill the through-holes. In one embodiment, the conductive layer in the plurality of through-holes can extend to the upper surface of the substrate SUB and/or to the lower surface of the substrate SUB. In one embodiment, the connecting elements VIA are respectively corresponding to and disposed below the first carrier CP1, the second carrier CP2, and the third carrier CP3. The dotted circles in FIG. 2A schematically illustrate the positions of the connecting elements VIA penetrating through the substrate SUB, exposed on the upper and lower surfaces, and covered by the first carrier CP1, the second carrier CP2, and the third carrier CP3.

Figure 2B:
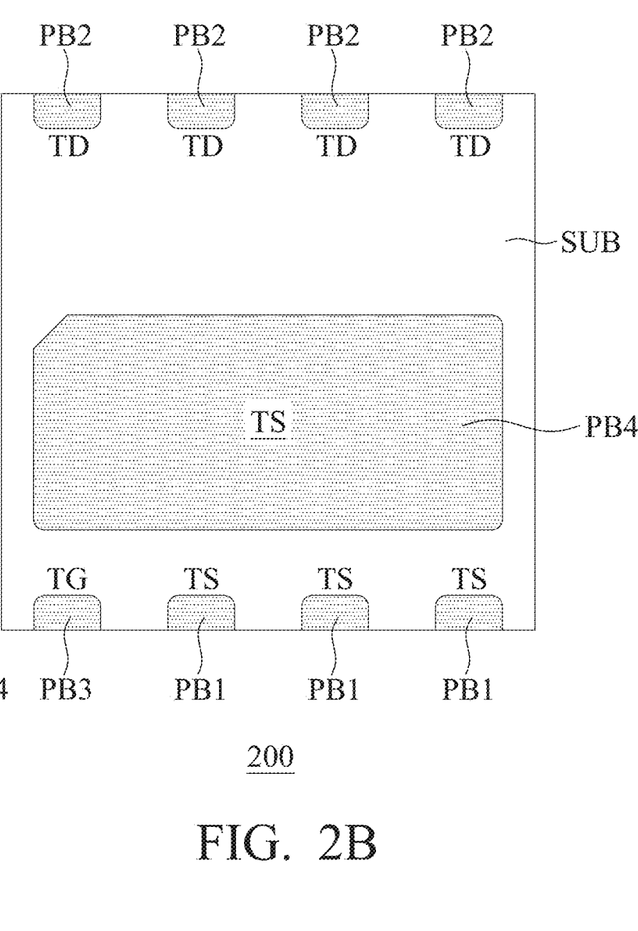
FIG. 2B shows a bottom view of the package structure in accordance with an embodiment of the present disclosure.

FIG. 2B shows a bottom view of the package structure 200 in accordance with an embodiment of the present disclosure, wherein the package structure 200 corresponds to the integrated transistor TINT in FIG. 1. As shown in FIG. 2B, the package structure 200 further includes first bottom plates PB1, second bottom plates PB2, a third bottom plate PB3, and a fourth bottom plate PB4, wherein the first bottom plates PB1, the second bottom plates PB2, the third bottom plate PB3, and the fourth bottom plate PB4 are formed below the substrate SUB.

The first bottom plates PB1 are corresponding to the first carrier CP1 and disposed below the substrate SUB. The connecting elements VIA shown in FIG. 2A is corresponding to and disposed on the first bottom plates PB1, and the first bottom plates PB1 are electrically connected to the first carrier CP1 through the connecting elements VIA. The quantity of the first bottom plates PB1 can be designed as one or more according to user requirements. In the present embodiment, the number of the first bottom plate PB1 is three. According to an embodiment of the present disclosure, the first bottom plates PB1 can be configured as terminals, such as terminals of an SMD package for external electrical connection. In one embodiment, the first bottom plates PB1 are configured to form the source terminal TS of the integrated transistor TINT in FIG. 1.

The second bottom plates PB2 are disposed below the substrate SUB corresponding to the second carrier CP2. The connecting elements VIA are correspondingly disposed on the second bottom plates PB2, and the second bottom plates PB2 are electrically connected to the second carrier PC2 via the connecting elements VIA. The quantity of the second bottom plates PB2 can be designed as one or more according to user requirements. In the present embodiment, the number of the second bottom plates PB2 is four. According to an embodiment of the present disclosure, the second bottom plates PB2 can be configured as terminals, such as terminals of an SMD package for external electrical connection. In one embodiment, the second bottom plates PB2 is configured to form the drain terminal TD of the integrated transistor TINT in FIG. 1.

The third bottom plate PB3 is disposed below the substrate SUB corresponding to the third carrier CP3. The connecting elements VIA are correspondingly disposed on the third base plate PB3, and the third bottom plate PB3 is electrically connected to the third carrier CP3 via the connecting elements VIA. The quantity of the third bottom plate PB3 can be designed as one or more according to user requirements. In the present embodiment, the number of the third bottom plate PB3 is one. According to an embodiment of the present disclosure, the third bottom plate PB3 can be configured as a terminal, such as a terminal of an SMD package for external electrical connection. In one embodiment, the third bottom plate PB3 is configured to form the gate terminal TG of the integrated transistor TINT in FIG. 1.

The fourth bottom plate PB4 is formed below the substrate SUB corresponding to the position of the first carrier CP1 and the transistor T1. The connecting elements VIA are correspondingly disposed on the fourth bottom plate PB4, and the fourth bottom plate PB4 is electrically connected to the first carrier CP1 through the connecting elements VIA. The quantity of the fourth bottom plate PB4 can be designed as one or more according to user requirements. In the present embodiment, the number of the fourth bottom plate PB4 is one. According to an embodiment of the present disclosure, the fourth bottom plate PB4 may be configured as a terminal, such as a terminal of an SMD package for external electrical connection. In one embodiment, the fourth bottom plate PB4 is configured to assist the transistor T1 in heat dissipation and to assist the source terminal TS of the transistor T1 to have better grounding performance.

The first bottom plates PB1, the second bottom plates PB2, the third bottom plate PB3, and the fourth bottom plate PB4 may be made of the same or different metal materials. The metal materials include copper (Cu), silver (Ag), gold (Au), titanium (Ti), or nickel (Ni). The first carrier CP1, the second carrier CP2, the third carrier CP3, and the fourth carrier CP4 may be made of the same or different metal materials. The metal materials include copper (Cu), silver (Ag), gold (Au), titanium (Ti), or nickel (Ni). The connecting elements VIA may be made of metal material. The metal material includes copper (Cu), silver (Ag), gold (Au), titanium (Ti), or nickel (Ni). The first bottom plates PB1, the second bottom plates PB2, the third bottom plate PB3, the fourth bottom plate PB4, the first carrier CP1, the second carrier CP2, the third carrier CP3, the fourth carrier CP4, and the connecting elements VIA may be formed of the same or different metal materials. In one embodiment, the first bottom plates PB1, the second bottom plates PB2, the third bottom plate PB3, the fourth bottom plate PB4, the first carrier CP1, the second carrier CP2, the third carrier CP3, the fourth carrier CP4, and the connecting elements VIA are formed of the same metal material, such as copper (Cu), silver (Ag), gold (Au), titanium (Ti) or nickel (Ni).

Figure 3:
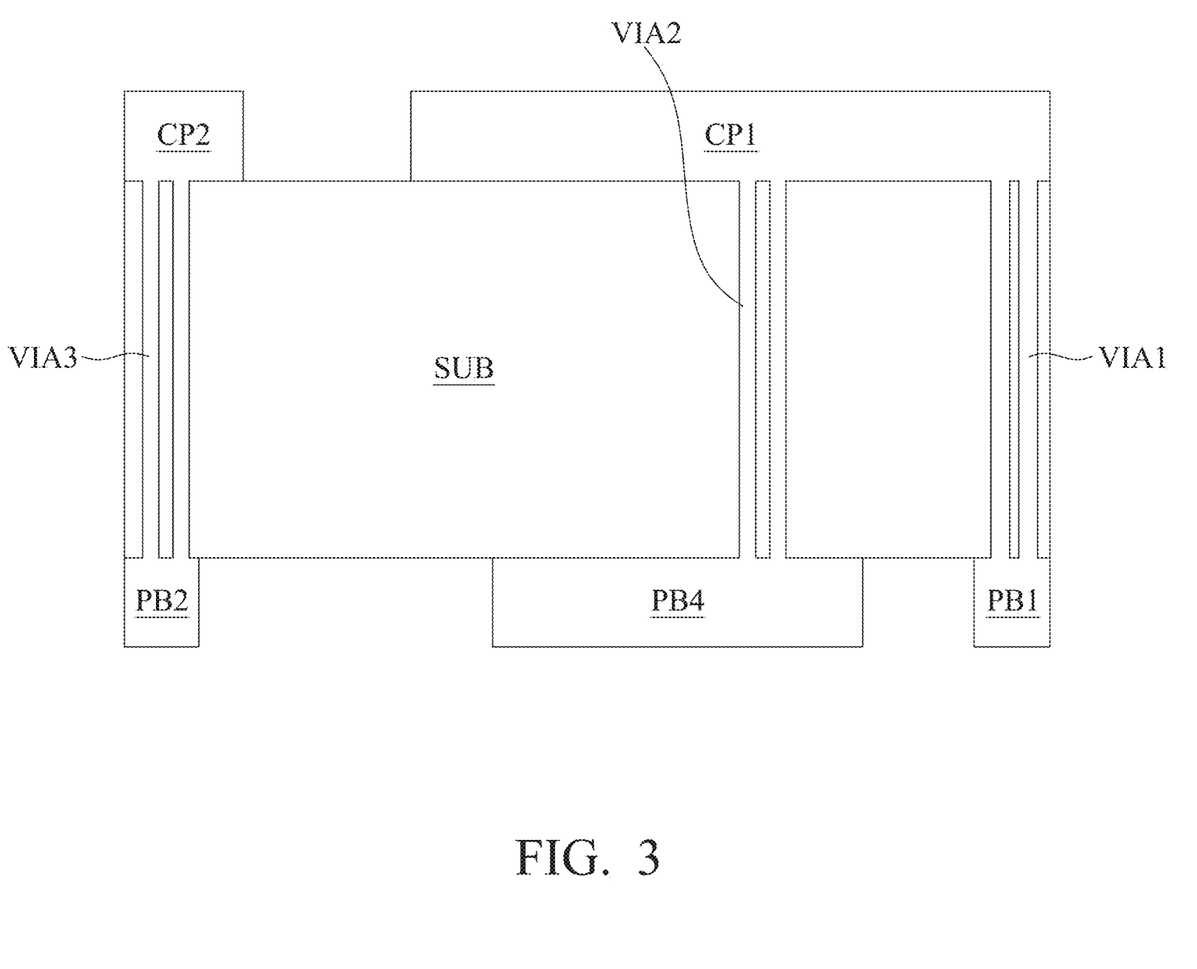
FIG. 3 shows a cross-sectional view of a package structure in accordance with an embodiment of the present disclosure.

FIG. 3 shows a cross-sectional view of a package structure in accordance with an embodiment of the present disclosure, and the cross-sectional view of FIG. 3 is cut along the dotted line A-A' in FIG. 2A. As shown in FIG. 3, the first carrier CP1 and the second carrier CP2 of the package structure 200 are formed on the substrate SUB, and the first bottom plates PB1, the second bottom plates PB2, and the fourth bottom plate PB4 are disposed below the substrate SUB.

As shown in FIG. 3, the connecting elements VIA include a first connecting element VIA1 electrically connecting the first carrier CP1 and the first bottom plate PB1, a second connecting element VIA2 electrically connecting the first carrier CP1 and the fourth bottom plate PB4, and a third connecting element VIA3 electrically connecting the second carrier CP2 and the second bottom plate PB2.

Figure 4:
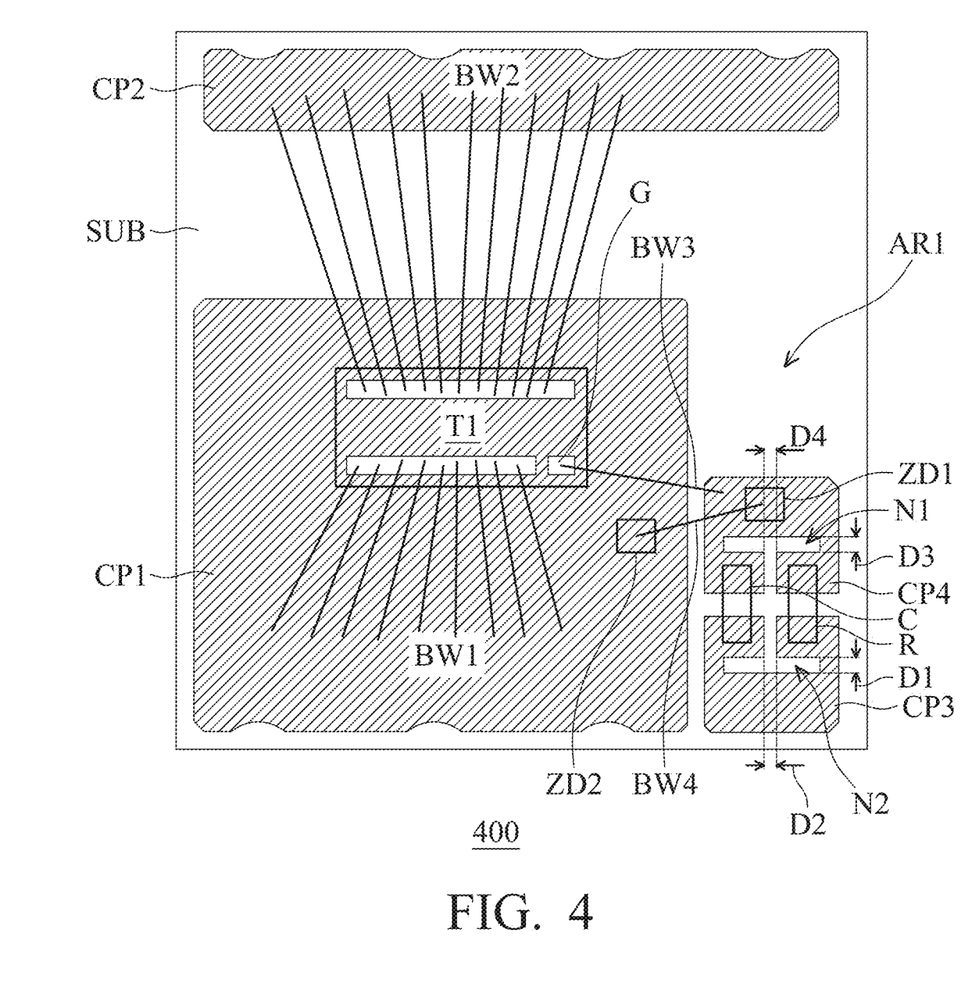
FIG. 4 shows a top view of a package structure in accordance with another embodiment of the present disclosure.

FIG. 4 shows a top view of a package structure 400 in accordance with another embodiment of the present disclosure, wherein the package structure 400 corresponds to the integrated transistor TINT in FIG. 1. According to an embodiment of the present disclosure, similar to the package structure 200 in FIG. 2A, the package structure 400 may be a package structure of a surface mount device. Comparing the package structure 400 in FIG. 4 with the package structure 200 in FIG. 2A, the area of the substrate SUB occupied by the first carrier CP1 in FIG. 4 is less than that in FIG. 2A. More specifically, the shape of the first carrier CP1 in FIG. 4 is relatively square, and there is no first carrier CP1 at the position of the first region AR1 on the substrate SUB. In addition, the third carrier CP3 and the fourth carrier CP4 further include a gap N2, and a gap N1 respectively. In one embodiment, the gap N2 of the third carrier CP3 may include a T-shaped gap, and the T-shaped gap includes the first spacing D1 and the second spacing D2. The gap N1 of the fourth carrier CP4 may include a T-shaped gap, and the T-shaped gap includes a third spacing D3 and a fourth spacing D4. In one embodiment, the first spacing D1 is substantially perpendicular to the second spacing D2, and the third spacing D3 is substantially perpendicular to the fourth spacing D4, but not intended to be limited thereto.

According to an embodiment of the present disclosure, compared with the embodiment in FIG. 2A, the first carrier CP1 of the package structure 400 has a less area, and the size of the first carrier CP1 can be shrunk without affecting the function of the first carrier CP1 so as to reduce the cost of production. As shown in FIG. 4, the first spacing D1 is adjacent to the resistor R and the capacitor C on the third carrier CP3. The second spacing D2 is between the resistor R and the capacitor C on the third carrier CP3. The third spacing D3 is between the first Zener diode ZD1 and the resistor R/capacitor C on the fourth carrier CP4. The fourth spacing D4 is between the resistor R and the capacitor C on the fourth carrier CP4.

According to an embodiment of the present disclosure, when the resistor R and the capacitor C are mounted on the third carrier CP3 and the fourth carrier CP4 by solder paste, since the T-shaped gap of the third carrier CP3 includes the first spacing D1 and the second spacing D2 and the T-shaped gap of the fourth carrier CP4 includes the third spacing D3 and the fourth spacing D4, which can be configured as a channel for the release of excess melting solder paste, the T-shaped gaps prevents the solder paste from overflowing to other components, such as the first Zener diode ZD1, to avoid electrical issue of the components, such as short circuit.

As shown in FIG. 4, when the driving signal is provided to the gate G of the transistor T1 through the third carrier CP3 of the package structure 400, the resistor R, the capacitor C, the fourth carrier CP4, and the third metal bonding wire BW3, since the first Zener diode ZD1 is disposed between the third metal bonding wire BW3, and the set consisting of the resistor R and the capacitor C and is connected to the second Zener diode ZD2 in reverse series, the voltage of the driving signal received by the third carrier CP3 is forcibly clamped by the first Zener diode ZD1 and the second Zener diode ZD2 before being provided to the gate G of the transistor T1. Therefore, the transistor T1 is able to be operated normally.

The package structure 400 may further include one or more first bottom plates PB1, second bottom plates PB2, third bottom plates PB3, and fourth bottom plates PB4, wherein the first bottom plates PB1, the second bottom plates PB2, the third bottom plates PB3, and the fourth bottom plates PB4 are formed below the substrate SUB (not shown). With respect to the bottom view of each of the bottom plates of the package structure 400, please refer to the bottom view of FIG. 2B, which will not be repeated herein.

In one embodiment, the package structure 400 in FIG. 4 may also include one or more connecting elements VIA similar as that in FIG. 2A. Regarding materials, functions, and ways of connection of the first carrier CP1, the second carrier CP2, the third carrier CP3, the fourth carrier CP4, the first bottom plates PB1, the second bottom plates PB2, the third bottom plates PB3, the fourth bottom plates PB4, and the connecting elements VIA in FIG. 4, please refer to the description of the embodiment in FIG. 2A and FIG. 2B, which will not be repeated herein.

Figure 5A:
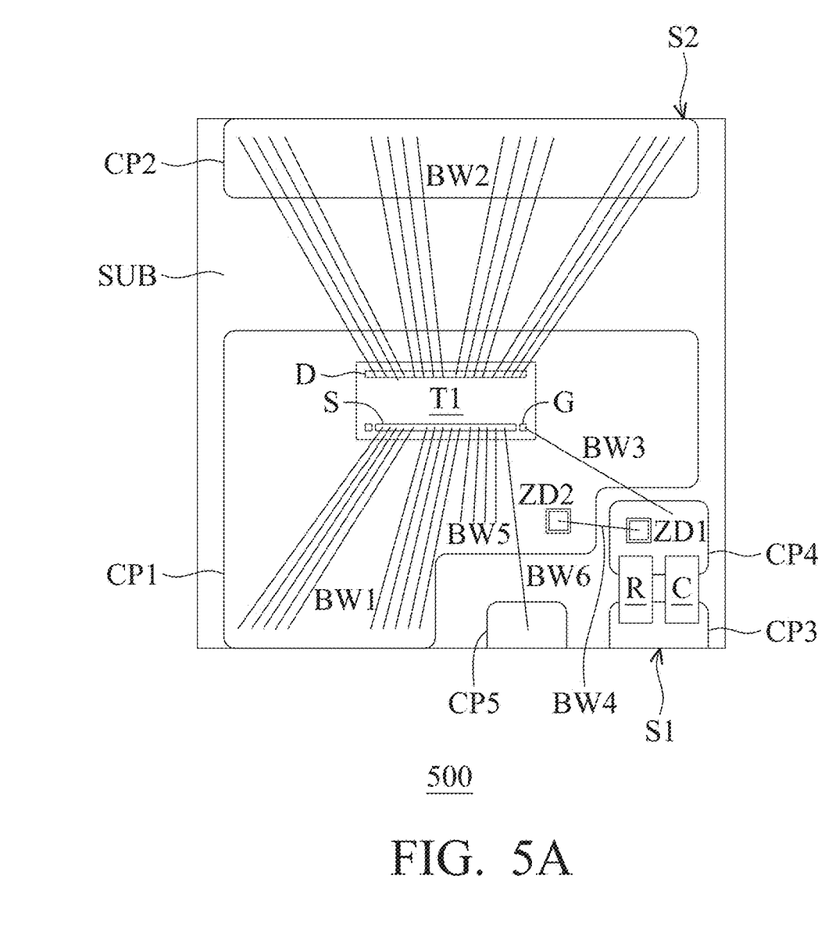
FIG. 5A shows a top view of a package structure in accordance with an embodiment of the present disclosure.
Figure 5B:
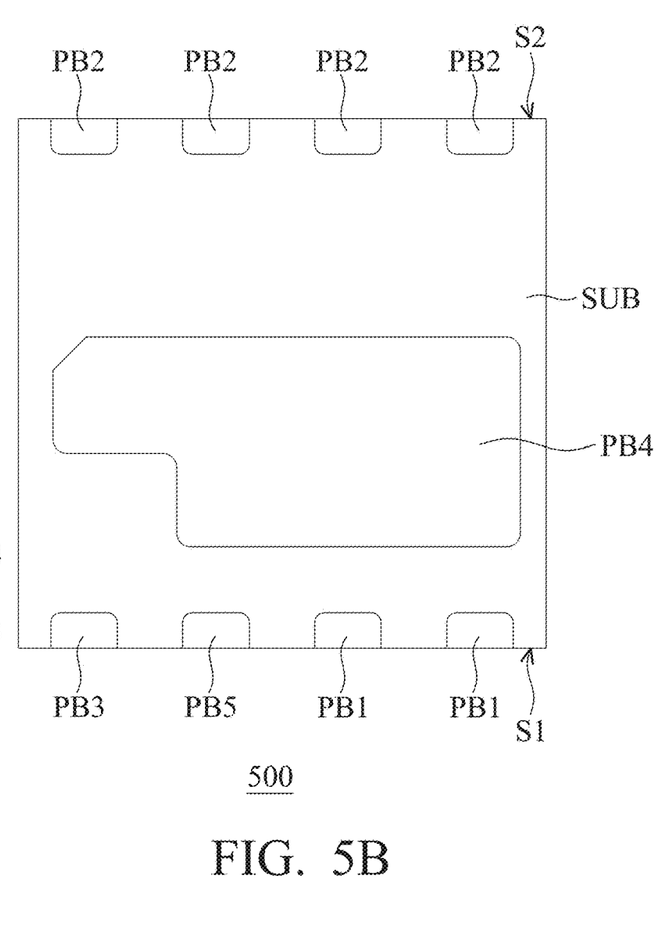
FIG. 5B shows a bottom view of a package structure in accordance with an embodiment of the present disclosure.

FIG. 5A shows a top view of a package structure 500 in accordance with an embodiment of the present disclosure, and FIG. 5B shows a bottom view of the package structure 500 in accordance with an embodiment of the present disclosure, wherein the package structure 500 corresponds to the integrated transistor TINT in FIG. 1. According to an embodiment of the present disclosure, the package structure 500 may be a package structure of a surface mount device. The difference between the package structure 500 and the package structure 200 in FIG. 2A is that the package structure 500 further includes a fifth carrier CP5 disposed on the substrate SUB and adjacent to one side of the substrate SUB. The source S of the transistor T1 is electrically connected to the first carrier CP1 and the fifth carrier CP5 through a plurality of metal bonding wires. More specifically, the source S of the transistor T1 is electrically connected to the first carrier CP1 through a plurality of first metal bonding wires BW1 and a plurality of fifth metal bonding wires BW5. The source S of the transistor T1 is electrically connected to the fifth carrier CP5 through one or a plurality of sixth metal bonding wires BW6. The drain D of the transistor T1 is electrically connected to the second carrier CP2 through a plurality of second metal bonding wires BW2, and the gate G of the transistor T1 is electrically connected to the fourth carrier CP4 through one or a plurality of third metal bonding wires BW3.

As shown in FIG. 5B, the difference between the package structure 500 and the package structure 200 in FIG. 2B is that, in addition to the first bottom plates PB1, the second bottom plates PB2, the third bottom plate PB3, and the fourth bottom plate PB4, the package structure 500 further includes a fifth bottom plate PB5 formed below the substrate SUB (lower surface). The position of the fifth bottom plate PB5 corresponds to that of the fifth carrier CP5 and is disposed below the substrate SUB.

Figure 5C:
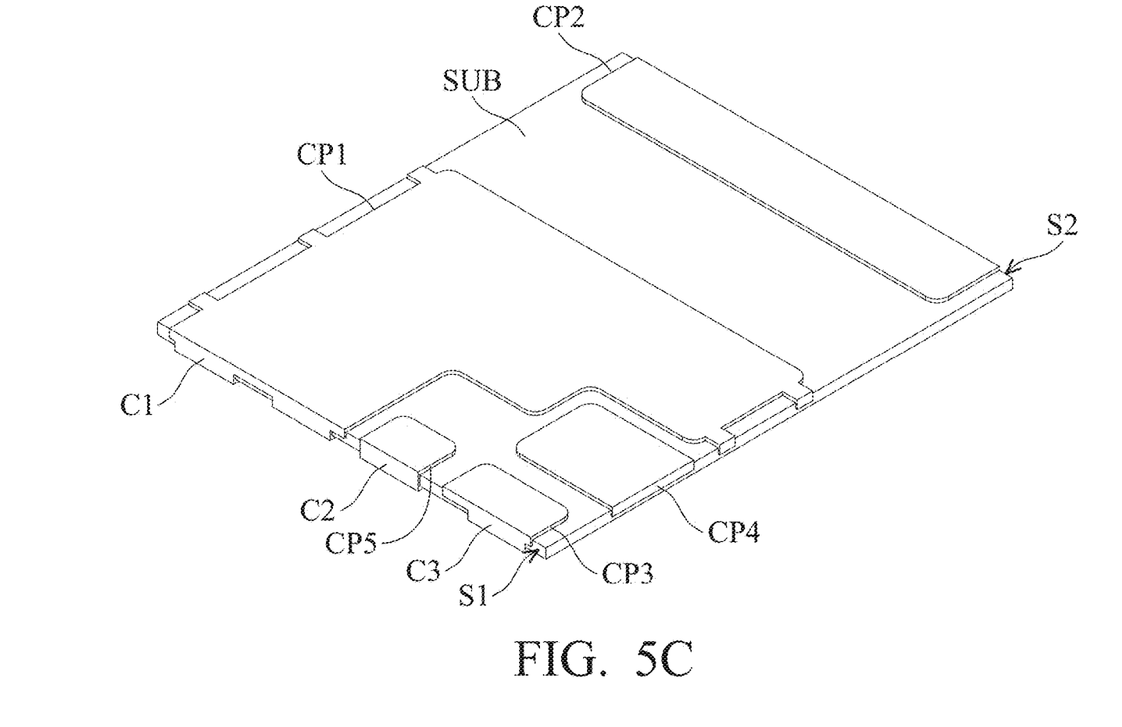
FIG. 5C shows a 3D schematic view of a package structure in accordance with an embodiment of the present disclosure.
Figure 5D:
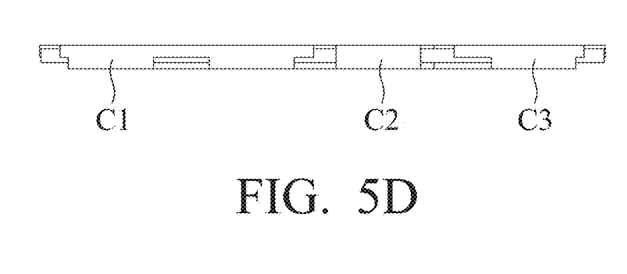
FIG. 5D shows a side view of a package structure in accordance with an embodiment of the present disclosure.
Figure 5E:
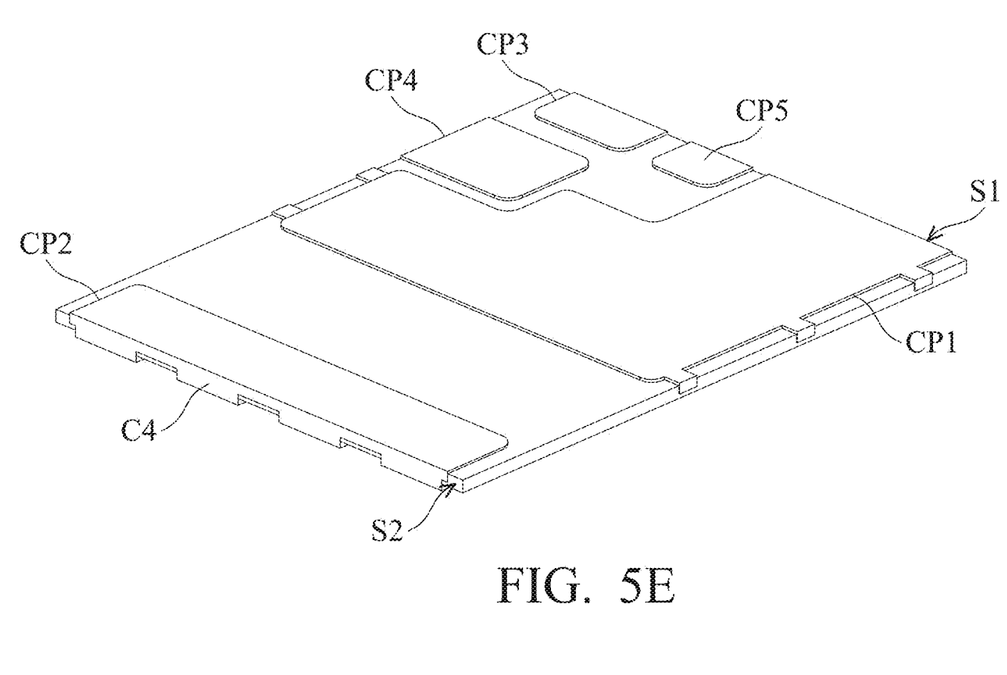
FIG. 5E shows a 3D schematic view of a package structure in accordance with an embodiment of the present disclosure.
Figure 5F:
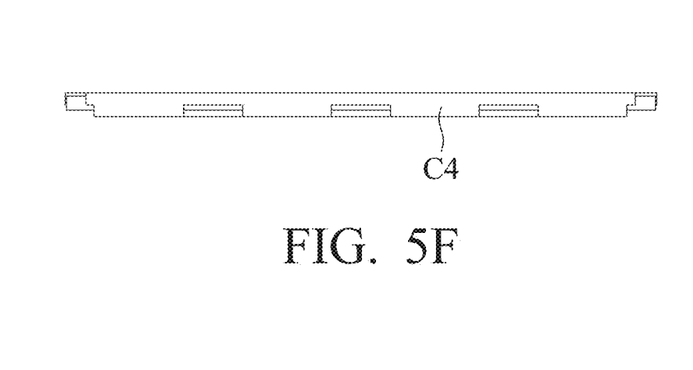
FIG. 5F shows a side view of a package structure in accordance with an embodiment of the present disclosure.

FIG. 5C shows a 3D schematic view of the package structure 500 in accordance with an embodiment of the present disclosure. FIG. 5D shows a side view of the package structure 500 in accordance with an embodiment of the present disclosure. FIG. 5E shows a 3D schematic view of the package structure 500 in accordance with an embodiment of the present disclosure. FIG. 5F shows a side view of the package structure 500 in accordance with an embodiment of the present disclosure. Referring to FIGS. 5A-5D, the substrate SUB has a first side surface S1 and a second side surface S2 between the upper surface and the lower surface of the substrate SUB, and the first side surface S1 is opposite to the second side surface S2. The package structure 500 further includes connecting elements C1, C2, C3, and C4 disposed on the first side surface S1 and the second side surface S2. The first bottom plates PB1 are corresponding to the first carrier CP1 and disposed below the substrate SUB. The first bottom plates PB1 and the first carrier CP1 are electrically connected to each other through the connecting element C1 disposed on the first side surface S1 of the substrate SUB. The fifth bottom plate PB5 is disposed below the fifth carrier CP5. The fifth bottom plate PB5 and the fifth carrier CP5 are connected to each other through the connecting element C2 disposed on the first side surface S1 of the substrate SUB. The third bottom plate PB3 is disposed below the third carrier CP3. The third bottom plate PB3 and the third carrier CP3 are connected to each other through the connecting element C3 disposed on the first side surface S1 of the substrate SUB.

Please refer to FIGS. 5A-5B and FIGS. 5E-5F, the second bottom plates PB2 are disposed below the second carrier CP2. The second bottom plates PB2 and the second carrier CP2 are connected to each other through the connecting element C4 disposed on the second side surface S2 of the substrate SUB.

The first bottom plates PB1 are disposed below the substrate SUB corresponding to the first carrier CP1. The number of the first bottom plate PB1 can be designed as one or more according to user requirements. In the present embodiment, the number of the first bottom plate PB1 is two. According to an embodiment of the present disclosure, the first bottom plate PB1 can be configured as terminals, such as terminals of an SMD package for external electrical connection. In one embodiment, the first bottom plate PB1 is configured to form the source terminal TS of the integrated transistor TINT in FIG. 1. The fifth bottom plate PB5 is disposed below the substrate SUB corresponding to the fifth carrier CP5. The number of the fifth bottom plate PB5 can be designed as one or more according to user requirements. In the present embodiment, the number of the fifth bottom plate PB5 is one. According to an embodiment of the present disclosure, the fifth bottom plate PB5 may be configured as a terminal, such as a terminal of an SMD package for external electrical connection. In one embodiment, the fifth bottom plate PB5 is configured to form the source terminal TS of the integrated transistor TINT in FIG. 1.

The third bottom plate PB3 is disposed below the substrate SUB corresponding to the third carrier CP3. The number of the third bottom plate PB3 can be designed as one or more according to the user requirements. In the present embodiment, the number of the third bottom plate PB3 is one. According to an embodiment of the present disclosure, the third bottom plate PB3 can be configured as a terminal, such as a terminal of an SMD package for external electrical connection. In one embodiment, the third bottom plate PB3 is configured to form the gate terminal TG of the integrated transistor TINT in FIG. 1.

The fourth bottom plate PB4 is disposed below the substrate SUB corresponding to the first carrier CP1 and the transistor T1. The number of the fourth bottom plate PB4 can be designed as one or more according to user requirements. In the present embodiment, the number of the fourth bottom plate PB4 is one. The fourth bottom plate PB4 can be connected to the first carrier CP1 through the connecting elements VIA similar to those shown in FIG. 2A (not shown in FIG. 5A and FIG. 5B). According to an embodiment of the present disclosure, the fourth bottom plate PB4 may be configured as a terminal, such as a terminal of an SMD package for external electrical connection. In one embodiment, the fourth bottom plate PB4 is configured to assist the transistor T1 to dissipate heat and to assist the source terminal TS of the transistor T1 to have better grounding performance.

The second bottom plates PB2 are disposed below the substrate SUB corresponding to the second carrier CP2. The number of the second bottom plate PB2 can be designed as one or more according to user requirements. In the present embodiment, the number of the second bottom plate PB2 is four. According to an embodiment of the present disclosure, the second bottom plate PB2 can be configured as terminals, such as terminals of an SMD package for external electrical connection. In one embodiment, the second bottom plate PB2 is configured to form a drain terminal TD of the integrated transistor TINT in FIG. 1.

The first carrier CP1, the second carrier CP2, the third carrier CP3, the fourth carrier CP4, and the fifth carrier CP5 may be made of the same or different metal materials. The first bottom plates PB1, the second bottom plates PB2, the third bottom plate PB3, the fourth bottom plate PB4, and the fifth bottom plate PB5 may be made of the same or different metal materials. The connecting elements C1, C2, C3, C4 may be made of the same or different metal materials. The first bottom plates PB1, the second bottom plates PB2, the third bottom plate PB3, the fourth bottom plate PB4, the fifth bottom plate PB5, the first carrier CP1, the second carrier CP2, the third carrier CP3, the fourth carrier CP4, the fifth carrier CP5, and the connecting elements C1, C2, C3, C4 may be formed of the same or different metal materials. In one embodiment, the first carrier CP1, the second carrier CP2, the third carrier CP3, the fourth carrier CP4, the fifth carrier CP5, the first bottom plates PB1, the second bottom plates PB2, the third bottom plate PB3, the fourth bottom plate PB4, the fifth bottom plate PB5, and the connecting elements C1, C2, C3, C4 are formed of the same metal material. The metal material includes copper (Cu), silver (Ag), gold (Au), titanium (Ti), or nickel (Ni).

According to an embodiment of the present application, the first carrier CP1 and the fifth carrier CP5 are separated with each other and disposed on the upper surface of the substrate SUB. Therefore, when performing four-wire measurement, the source S of the transistor T1 is respectively connected to the first carrier CP1 and the fifth carrier CP5 through the plurality of first metal bonding wires BW1 and the sixth metal bonding wire BW6, the first carrier CP1 can be configured to apply a measuring signal, such as a measuring current or a measuring voltage to the transistor T1, and the fifth carrier CP5 can be configured to receive an output signal generated by the transistor T1 after receiving the measuring signal. The output signal is transmitted to the circuit board for processing and analysis to obtain a current value or a voltage value of the transistor T1, so that the measurement results can be more accurate.

Figure 6A:
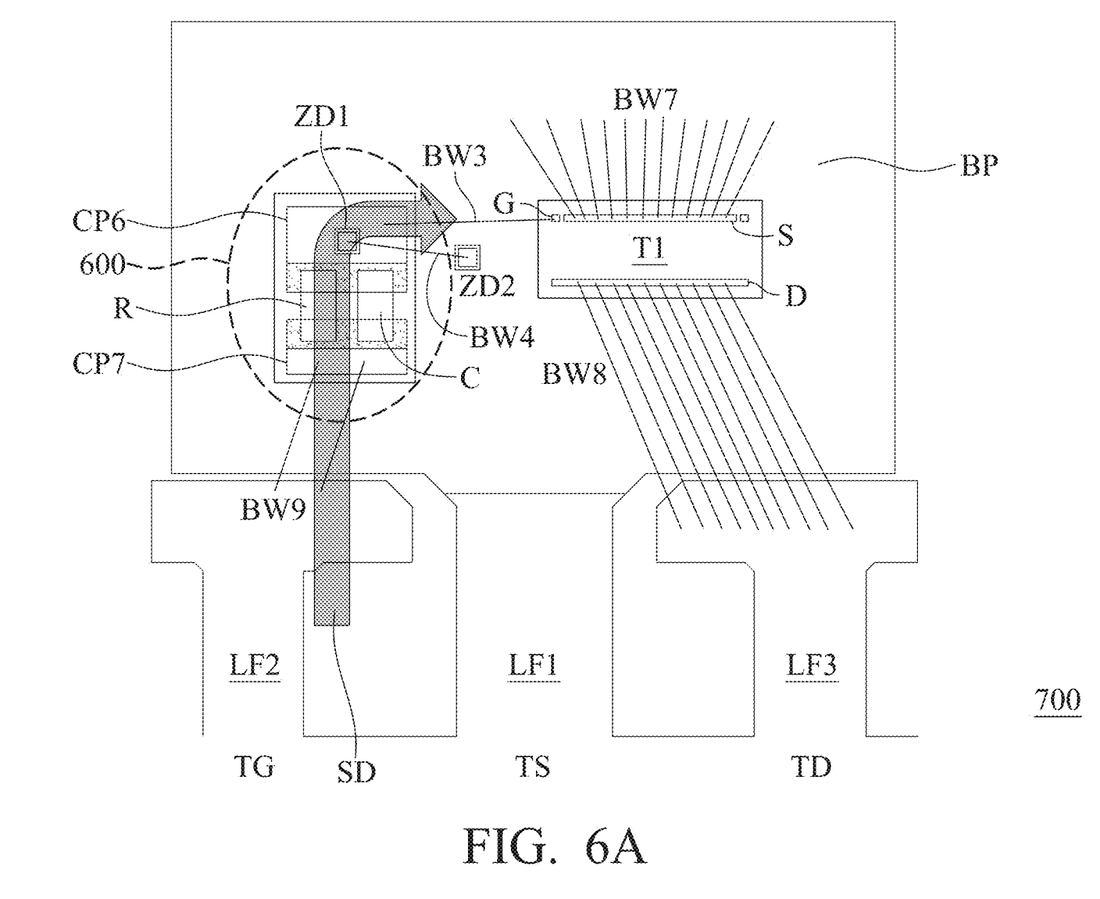
FIG. 6A shows a top view of a package structure in accordance with an embodiment of the present disclosure.
Figure 6B:
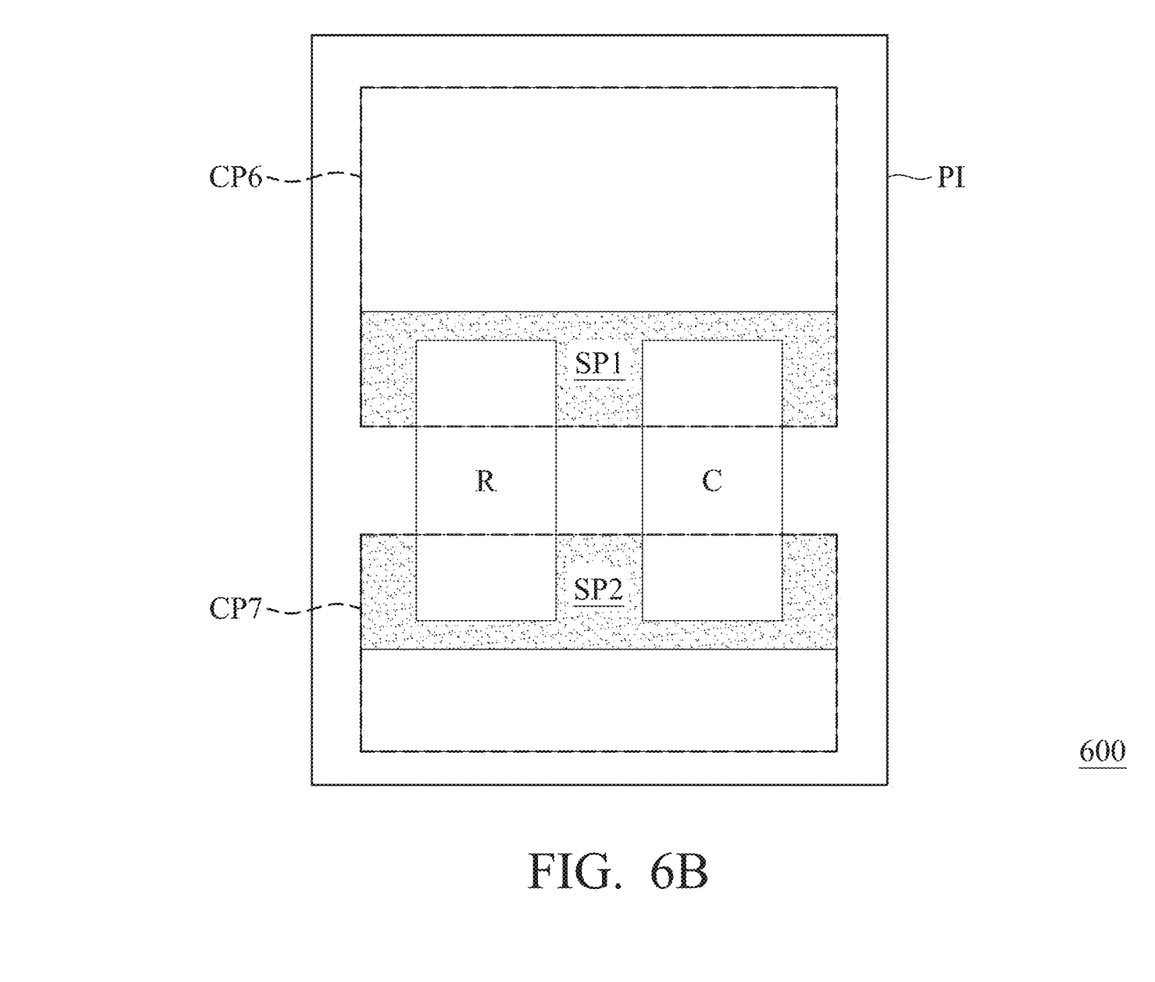
FIG. 6B is an enlarged schematic view of the laminated structure 600 shown in FIG. 6A.

FIG. 6A shows a top view of a package structure 700 in accordance with an embodiment of the present disclosure, and FIG. 6B is an enlarged schematic view of the laminated structure 600 shown in FIG. 6A. The package structure 700 corresponds to the integrated transistor TINT in FIG. 1. As shown in FIG. 6A, the package structure 700 includes a bottom plate BP, a first lead frame LF1, a second lead frame LF2, and a third lead frame LF3, wherein the bottom plate BP is electrically connected to the first lead frame LF1. According to an embodiment of the present disclosure, the bottom plate BP is a conductive plate and is connected to the first lead frame LF1. For example, the bottom plate BP and the first lead frame LF1 are connected to each other by integrated molding. In one embodiment, the bottom plate BP, the first lead frame LF1, the second lead frame LF2, and the third lead frame LF3 are formed by integrated molding. The bottom plate BP, the first lead frame LF1, the second lead frame LF2, and the third lead frame LF3 may be made of the same or different metal materials. In one embodiment, the bottom plate BP, the first lead frame LF1, the second lead frame LF2, and the third lead frame LF3 include the same metal material. The metal material includes copper (Cu), silver (Ag), gold (Au), titanium (Ti), or nickel (Ni). According to an embodiment of the present disclosure, the package structure 700 may be a transistor outline (TO) package structure.

As shown in FIG. 6A and FIG. 6B, in the present embodiment, the package structure 700 further includes a laminated structure 600 formed on the bottom plate BP. The laminated structure 600 includes an insulating plate PI, a sixth carrier CP6 and a seventh carrier CP7 formed on the insulating plate PI. The resistor R and the capacitor C in FIG. 1 are disposed on the sixth carrier CP6 and the seventh carrier CP7 and electrically connected between the sixth carrier CP6 and the seventh carrier CP7. In one embodiment, both the sixth carrier CP6 and the seventh carrier CP7 are conductive carriers, such as metal conductive carriers. The sixth carrier CP6 and the seventh carrier CP7 may be made of the same or different metal materials. In one embodiment, the sixth carrier CP6 and the seventh carrier CP7 are formed of the same metal material, such as copper (Cu), silver (Ag), gold (Au), titanium (Ti), nickel (Ni) or alloys thereof. The sixth carrier CP6 and the seventh carrier CP7 may include single or multiple metal layers. In the present embodiment, the sixth carrier CP6 and the seventh carrier CP7 are copper (Cu)/gold (Au) stack. According to an embodiment of the present disclosure, the insulating plate PI may be a ceramic substrate, and the material of the ceramic substrate may include aluminum oxide or aluminum nitride.

As shown in FIG. 6B, the resistor R and the capacitor C are respectively connected to and soldered on the sixth carrier CP6 and the seventh carrier CP7. In one embodiment, the package structure 700 further includes a first insulating layer SP1 and a second insulating layer SP2. When the resistor R and the capacitor C are solder bonded on the sixth carrier CP6 and the seventh carrier CP7, the first insulating layer SP1 is formed on the sixth carrier CP6 except the bonding position of the resistor R, the capacitor C and the sixth carrier CP6, and the second insulating layer SP2 is formed on the seventh carrier CP7 except the bonding position of the resistor R, the capacitor C and the seventh carrier CP7. The first insulating layer SP1 and the second insulating layer SP2 can be configured as a solder resist layer during solder bonding. The material of the solder resist layer may include epoxy resin, ethyl carbamate (urethane), or ethyl resin.

In the present embodiment, the transistor T1 and the second Zener diode ZD2 as shown in FIG. 1 can be disposed on the bottom plate BP of the package structure 700 as shown in FIG. 6A, wherein the source S of the transistor T1 is electrically connected to the bottom plate BP through one or a plurality of seventh metal bonding wires BW7, and the drain D of the transistor T1 is electrically connected to the third lead frame LF3 through one or a plurality of eighth metal bonding wires BW8. The second cathode NC2 (not shown in FIG. 6A) of the second Zener diode ZD2 is electrically connected to the bottom plate BP by direct contact or indirect contact. According to an embodiment of the present disclosure, the second cathode NC2 is electrically connected to the bottom plate BP by soldering and fixing the second Zener diode ZD2 on the bottom plate BP.

The first Zener diode ZD1 shown in FIG. 1 is disposed on the sixth carrier CP6. The first cathode NC1 (not shown in FIG. 6A) of the first Zener diode ZD1 is electrically connected to the sixth carrier CP6 by direct or indirect contact. According to an embodiment of the present disclosure, the first cathode NC1 is electrically connected to the sixth carrier CP6 by soldering and fixing the first Zener diode ZD1 on the sixth carrier CP6. The gate G of the transistor T1 is electrically connected to the sixth carrier CP6 through the third metal bonding wire BW3, then electrically connected to the first Zener diode ZD1 through the sixth carrier CP6 and the first cathode NC1. The first anode NA1 (not shown in FIG. 6A) of the first Zener diode ZD1 is electrically connected to the second anode NA2 of the second Zener diode ZD2 (not shown in FIG. 6A) through the fourth metal bonding wire BW4. The seventh carrier CP7 is electrically connected to the second lead frame LF2 through a plurality of ninth metal bonding wires BW9. In one embodiment, a metal structure including a material of titanium (Ti), nickel (Ni), silver (Ag) or an alloy thereof may be interposed between the laminated structure 600 and the bottom plate BP. The metal structure can be a single layer or multiple metal layers, and the metal structure is configured to fix the laminated structure 600 on the bottom plate BP. According to an embodiment of the present disclosure, the way of fixing includes soldering.

According to an embodiment of the present disclosure, the first lead frame LF1 forms the source terminal TS of the integrated transistor TINT shown in FIG. 1, the second lead frame LF2 forms the gate terminal TG of the integrated transistor TINT shown in FIG. 1, and the third lead frame LF3 forms the drain terminal TD of the integrated transistor TINT in FIG. 1.

According to an embodiment of the present disclosure, the package structure 700 forms the integrated transistor TINT in FIG. 1. As shown in FIG. 7, the package structure 700 receives the driving signal SD from the second lead frame LF2 (that is, the gate terminal TG of the integrated transistor TINT), and transmits the driving signal SD to the gate G of the transistor T1 through the resistor R, the capacitor C, the first Zener diode ZD1 (including the second Zener diode ZD2 optionally), and the third metal bonding wire BW3.

The package structure 700 may further include an encapsulation structure, and the encapsulation structure includes a resin material, such as epoxy resin. In one embodiment, the encapsulation structure may be black glue. In one embodiment, the encapsulation structure may enclose the bottom plate BP, the transistor T1, the second Zener diode ZD2 and the laminated structure 600 on the bottom plate BP, a part of the first lead frame LF1, a part of the second lead frame LF2, and a part of the third lead frame LF3.

Since the voltage of the driving signal SD passing through the first Zener diode ZD1 and the second Zener diode ZD2 is clamped before being provided to the gate G of the transistor T1, it can ensure that the driving signal provided to the gate G of the first transistor T1 is within the safe operating range. In addition, the length of the third metal bonding wire BW3 can be shortened by reducing the distance between the gate G of the transistor T1 and the sixth carrier CP6, thereby reducing the magnitude of the parasitic inductance caused by the third metal bonding wire BW3 and further reducing the level of the voltage fluctuation of the gate G of the transistor T1. The durability of the transistor T1 is also improved accordingly.

According to a comparative example of the present disclosure, there is only a transistor packaged in a package structure, excluding the resistor, the capacitor, and the Zener diodes. In an application circuit, the comparative example of the transistor package structure, an external resistor, an external capacitor, and external Zener diodes are disposed on a circuit board in a layout of the circuit diagram of FIG. 1. Due to the existence of the bonding wires for electrical connection among the external resistor (or the external capacitor), the external Zener diodes, and the transistor package structure on the circuit board, each of the bonding wires has a routing distance. In operation of the application circuit, the bonding wires will generate parasitic inductance. The parasitic inductance between the external Zener diodes and the gate of the transistor in the comparative example is far greater than the parasitic inductance between the first Zener diode ZD1 and the gate G of the transistor T1 (that is, the parasitic inductance generated by the third metal bonding wire BW3) in the package structure 700 due to a longer routing distance the comparative example has. As the parasitic inductance between the gate of the transistor and the Zener diode increases in the comparative example, the voltage fluctuation of the gate of the transistor becomes larger, then the gate of the transistor will be broken down more easily.

By contrast, please refer to FIG. 6A, the length (routing distance) of the third metal bonding wire BW3 in the package structure 700 can be shortened by adjusting the position of the gate G of the transistor T1 and the position of the sixth carrier CP6, thereby reducing the parasitic inductance between the gate G of the transistor T1 and the first Zener diode ZD1. In other words, the protection circuit of the transistor T1, such as the resistor R, the capacitor C, the first Zener diode ZD1, and the second Zener diode ZD2, and the transistor T1 packaged in the same package structure is beneficial for improving the durability of the transistor T1. In addition, the package structure 700 in FIG. 6A is beneficial for reducing the overall required circuit area and reducing the complexity of the circuit design.

The present disclosure provides a package structure packaging the transistor and a protection circuit. By integrating the transistor and its protection circuit in the same package, the distances among the gate of the transistor and the resistor, capacitor, and Zener diodes are shortened to reduce the parasitic inductance, which is beneficial for improving the durability of the transistor. Furthermore, the package structure packaging the transistor and the protection circuit of the present disclosure can reduce the overall required circuit area on the circuit board to increase heat dissipation, reduce the defect loss in the mounting process, and even reduce the complexity of the circuit design as well.

Although some embodiments of the present disclosure and their advantages have been disclosed, it should be understood that various changes, substitutions and alterations can be made herein without departing from the spirit and scope of the present disclosure by a person having ordinary skill in the art. Moreover, the scope of the present disclosure is not intended to be limited to the particular embodiments of the processes, machines, manufacturing, material composition, devices, methods and steps described in the specification. As one of ordinary skill in the art will readily appreciate from the disclosed contents of embodiments of the present disclosure, processes, machines, manufacturing, material composition, devices, methods, and steps, presently existing or later to be developed, that perform substantially the same function or achieve substantially the same result in the embodiments described herein may be utilized according to embodiments of the present disclosure. Accordingly, the appended claims are intended to include above-mentioned processes, machines, manufacturing, material composition, devices, methods, and steps.

What is claimed is:

1. A package structure, comprising:
   a substrate;
   a first carrier, a second carrier, and a third carrier, each disposed on the substrate
   an integrated transistor, disposed on the substrate, wherein the integrated transistor comprises:
      a transistor, comprising a gate, a drain, and a source, wherein the drain is electrically connected to the second carrier, and the gate is electrically connected to the third carrier;
      a capacitor, electrically connected to the gate;
      a resistor, electrically connected to the gate;
      a first Zener diode, comprising a first anode and a first cathode, wherein the first cathode is electrically connected to the gate; and
      a second Zener diode, comprising a second anode and a second cathode, wherein the second anode is electrically connected to the first anode, and the second cathode is electrically connected to the source through the first carrier; and
   an encapsulation structure, encapsulating the integrated transistor;
   wherein the package structure comprises a gate terminal, a drain terminal, and a source terminal.

2. The package structure of claim 1, wherein the transistor is an enhancement-mode high electron mobility transistor.

3. The package structure of claim 1, further comprising:
   a fourth carrier, disposed on the substrate, wherein the gate is electrically connected to the first cathode through the fourth carrier, and the capacitor and the resistor are electrically connected between the third carrier and the fourth carrier respectively.

4. The package structure of claim 3, wherein the transistor and the second Zener diode are disposed on the first carrier, the first Zener diode is disposed on the fourth carrier, and the capacitor and the resistor are disposed between the third carrier and the fourth carrier.

5. The package structure of claim 4, wherein each of the first carrier, the second carrier, the third carrier, and the fourth carrier is a conductive carrier, wherein the gate is adjacent to the fourth carrier, and electrically connected to the fourth carrier through a first bonding wire, wherein the first Zener diode is electrically connected to the second Zener diode through a second bonding wire, and the capacitor and the resistor are connected between the third carrier and the fourth carrier respectively.

6. The package structure of claim 1, further comprising:
   a first bottom plate, disposed below the substrate and the first carrier;
   a second bottom plate, disposed below the substrate and the second carrier;
   a third bottom plate, disposed below the substrate and the third carrier;
   a fourth bottom plate, disposed below the substrate, the first carrier, and the transistor; and
   a plurality of connecting elements;
   wherein the first bottom plate, the second bottom plate, and the third bottom plate are electrically connected to the first carrier, the second carrier, and the third carrier through three of the plurality of connecting elements respectively.

7. The package structure of claim 6, wherein the source terminal comprises the first bottom plate, the drain terminal comprises the second bottom plate, and the gate terminal comprises the third bottom plate.

8. The package structure of claim 6, wherein the first carrier is connected to the fourth bottom plate through another one of the plurality of connecting elements.

9. The package structure of claim 8, wherein the substrate comprises a plurality of through-holes through the substrate, and the plurality of connecting elements are formed in the through-holes respectively.

10. The package structure of claim 6, wherein the substrate comprises a plurality of side surfaces, and the connecting elements are formed on the side surfaces.

11. The package structure of claim 10, further comprising:
    a fifth carrier, disposed on the substrate, wherein the fifth carrier and the first carrier are separated from each other and disposed on the substrate; and
    a fifth bottom plate, disposed below the substrate and the fifth carrier;
    wherein the fifth carrier is electrically connected to the fifth bottom plate through another one of the plurality of connecting elements.

12. The package structure of claim 3, wherein the third carrier comprises a gap and/or the fourth carrier comprises a gap.

13. The package structure of claim 12, wherein the gap of the third carrier is T-shaped and/or the gap of the fourth carrier is T-shaped.

14. The package structure of claim 1, further comprising:
    an insulating plate, disposed on the substrate;
    a sixth carrier, disposed on the insulating plate; and
    a seventh carrier, disposed on the insulating plate, wherein the sixth carrier is electrically connected to the gate terminal;
    wherein the source and the second cathode are electrically connected to the substrate, and the capacitor and the resistor are electrically connected to the sixth carrier and the seventh carrier.

15. The package structure of claim 14, wherein the first Zener diode is disposed on the sixth carrier, and the capacitor and the resistor are disposed between the sixth carrier and the seventh carrier.

16. The package structure of claim 15, wherein the gate of the transistor is adjacent to the sixth carrier, and the gate is connected to the sixth carrier through a bonding wire.

* * * * *